(12) United States Patent  
Reynov et al.

(10) Patent No.: US 8,934,257 B1  
(45) Date of Patent: Jan. 13, 2015

(54) APPARATUS AND METHODS FOR COPLANAR PRINTED CIRCUIT BOARD INTERCONNECT

(75) Inventors: Boris Reynov, Cupertino, CA (US); Jack Kohn, Mountain View, CA (US); Victor Mei, Palo Alto, CA (US); Shreeram Siddhaye, Sunnyvale, CA (US); Ben Nitzan, El Granada, CA (US); Venkata Penmetsa, Cupertino, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 190 days.

(21) Appl. No.: 13/484,023

(22) Filed: May 30, 2012

(51) Int. Cl.  
  *H05K 1/18* (2006.01)

(52) U.S. Cl.  
  USPC .......... 361/763; 361/523; 361/718; 361/736; 361/776; 361/785; 361/803; 439/35; 439/67; 333/81 R; 174/255

(58) Field of Classification Search  
  CPC .......... H05K 1/14; H05K 1/18; H05K 1/142; H05K 1/148; H05K 3/03; H05K 3/301; H05K 3/361; H05K 3/305; H05K 3/363; H01R 12/00; H01R 12/04; H01R 12/52; H01R 12/62; H01R 9/096  
  USPC ......... 361/763, 523, 718, 736, 776, 785, 803; 439/35, 67; 333/81 R; 174/255  
  See application file for complete search history.

(56) References Cited

U.S. PATENT DOCUMENTS

| | | | | |
|---|---|---|---|---|
| 3,961,228 A | * | 6/1976 | Briggs et al. | 361/803 |
| 5,045,970 A | * | 9/1991 | Raschke | 361/718 |
| 5,263,868 A | * | 11/1993 | Renn et al. | 439/67 |
| 5,917,149 A | * | 6/1999 | Barcley et al. | 174/378 |
| 6,519,021 B1 | * | 2/2003 | Aruga | 349/152 |
| 6,531,662 B1 | * | 3/2003 | Nakamura | 174/255 |
| 6,594,152 B2 | * | 7/2003 | Dent | 361/785 |
| 7,286,370 B2 | * | 10/2007 | Ooyabu | 361/803 |
| 7,634,193 B2 | * | 12/2009 | Lang et al. | 396/542 |
| 8,115,289 B2 | * | 2/2012 | Kishibata | 257/678 |
| 2002/0105073 A1 | * | 8/2002 | Smith | 257/730 |
| 2005/0225930 A1 | * | 10/2005 | Stieglbauer et al. | 361/523 |
| 2005/0272182 A1 | * | 12/2005 | Smith | 438/106 |
| 2005/0272276 A1 | * | 12/2005 | Ooyabu | 439/35 |
| 2013/0169386 A1 | * | 7/2013 | Matono et al. | 333/81 R |
| 2013/0249542 A1 | * | 9/2013 | Zhao et al. | 324/244 |

OTHER PUBLICATIONS

Lee W. Ritchey, "A Survey and Tutorial of Dielectric Materials Used in the Manufacture of Printed Circuit Boards" Copyright held by Lee Ritchey of speeding edge, Sep. 1999, presented at PCB Design Conference west in Mar. 1999, pp. 1-10.

Altium "Interactive and Differential Pair Routing" AP0135 (v1.5) Jan. 7, 2008, pp. 1-27.

U.S. Appl. No. 13/434,386, filed Mar. 29, 2012 entitled Circuit Boards Defining Regions for Controlling a Dielectric Constant of a Dielectric Material.

* cited by examiner

*Primary Examiner* — Xiaoliang Chen  
(74) *Attorney, Agent, or Firm* — Cooley LLP

(57) ABSTRACT

In some embodiments, an apparatus includes a first substrate, a second substrate, a first coupler, and a second coupler. The first substrate is formed from a first material and includes an electrical pad. The second substrate is formed from a second material and includes an electrical pad. The first coupler is configured to mechanically couple the first substrate to the second substrate without a soldered connection. The second coupler includes a first end portion, configured to be soldered to the electrical pad of the first substrate, and a second end portion, configured to be soldered to the electrical pad of the second substrate. The second coupler configured to electrically couple the first substrate to the second substrate.

13 Claims, 7 Drawing Sheets

APPARATUS AND METHODS FOR COPLANAR PRINTED CIRCUIT BOARD INTERCONNECT

BACKGROUND

Some embodiments described herein relate generally to coupling multiple circuit boards substrates. More particularly, some embodiments, described herein relate to physically and electrically coupling multiple coplanar substrates to form a printed circuit board.

Some known electronic devices manufactured for high-speed signal transfer (e.g., operating at a relatively high frequency such as, for example, a frequency greater than 3 GHz) use printed circuit board (PCB) dielectric materials with specific characteristics. Often, such dielectric materials are configured to minimize losses, thereby facilitating the high-speed signal transfer. Such known dielectric materials are typically relatively expensive. For example, in some instances known high speed dielectric materials can be five to seven times the cost of a standard, commonly-used PCB substrate (e.g., FR-4).

In an effort to reduce the cost of known high speed PCBs, PCB designers often attempt to segregate high-speed electrical components (e.g., electrical components operating at relatively high frequencies such as, for example, frequencies above 3 GHz) from the other electrical components included in the PCB (e.g., electrical components operating at relatively non-high-speed or low frequencies such as, for example, frequencies at or below 3 GHz). In some known instances, the high speed electrical components are disposed on or in the high speed substrate and the non-high speed electrical components are disposed on a standard substrate such as, FR-4. By segregating the high speed electrical components the amount of the expensive dielectric material can be reduced. By disposing electrical components on multiple substrates, interconnects are used to electrically and/or physically couple the substrates.

In some instances, the use of interconnects can further increase the cost of the PCB. Furthermore, some known interconnects are configured to both physically (e.g., mechanically) and electrically couple the multiple substrates. In some instances, the physical coupling of the substrates, via the interconnects, can place the interconnects under undesirable strain. For example, in some instances, the PCB can be placed under strain such that a soldered coupling between the interconnect and the substrate can fail (e.g., break).

In some instances, the manufacturing process of the PCB including multiple substrates can include independently producing the multiple substrates prior to being physically and electrically coupled. In such instances, the manufacturing process can further include testing each substrate prior to physically and electrically coupling the substrates. Thus, the cost of the PCB can be further increased due to the increased number of process steps (e.g., testing each substrate).

Thus, a need exists for improved apparatus and methods for physically and electrically coupling multiple coplanar substrates to form a printed circuit board.

SUMMARY

Apparatus and methods for physically and electrically coupling multiple substrates to form a printed circuit board are described herein. In some embodiments, an apparatus includes a first substrate and a second substrate. The first substrate is formed from a first material and includes an electrical pad. The second substrate is formed from a second material and includes an electrical pad. A first coupler is configured to mechanically couple the first substrate to the second substrate without a soldered connection. A second coupler includes a first end portion, configured to be soldered to the electrical pad of the first substrate, and a second end portion, configured to be soldered to the electrical pad of the second substrate. The second coupler configured to electrically couple the first substrate to the second substrate.

DETAILED DESCRIPTION

Figure 1:
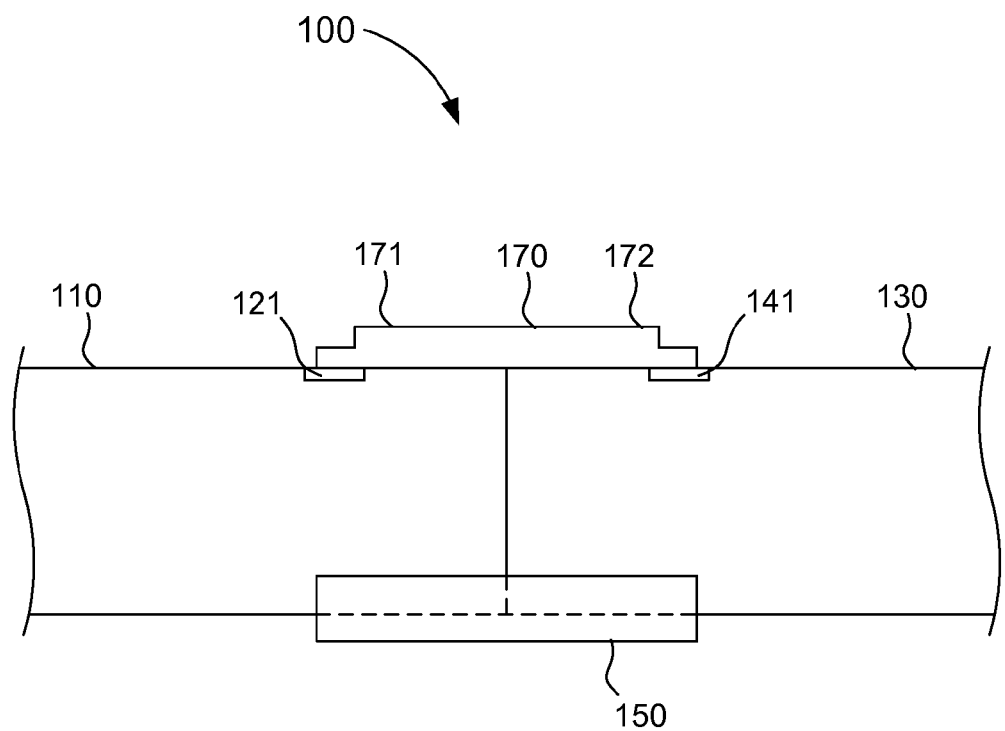
FIG. 1 is a front view schematic illustration of a portion of a printed circuit board, according to an embodiment.

Apparatus and methods for physically and electrically coupling multiple substrates to form a printed circuit board are described herein. In some embodiments, an apparatus includes a first substrate and a second substrate. The first substrate is formed from a first material and includes an electrical pad. The second substrate is formed from a second material and includes an electrical pad. A first coupler is configured to mechanically couple the first substrate to the second substrate without a soldered connection. A second coupler includes a first end portion, configured to be soldered to the electrical pad of the first substrate, and a second end portion, configured to be soldered to the electrical pad of the second substrate. The second coupler configured to electrically couple the first substrate to the second substrate.

In some embodiments, an apparatus includes a first substrate and a second substrate. The first substrate is formed from a first material and defines a first portion without electrical connections and a second portion with electrical connections. The second substrate is formed from a second material, different from the first, and defines a first portion without electrical connections and a second portion with electrical connections. A first coupler is configured to fixedly and mechanically couple to the first portion of the first substrate and the first portion of the second substrate. A second coupler is configured to fixedly and electrically couple to an electrical connection included in the second portion of the first substrate and an electrical connection included in the second portion of the second substrate.

In some embodiments, a method for forming a printed circuit board includes forming a first substrate from a first material and including an electrical pad and forming a second substrate from a second material, different from the first, and including an electrical pad. The method includes mechanically connecting (e.g., coupling) the first substrate and the second substrate without electrically connecting the first substrate and the second substrate to define an integrated substrate. The method further includes surface mounting electrical components on the integrated substrate including a coupler connected to the electrical pad of the first substrate and the electrical pad of the second substrate, thereby defining a printed circuit board. The method includes testing the printed circuit board after the printed circuit board is defined.

As used in this specification, the term "soldered connection" refers to known methods of applying a fused metal to join two or more metal work pieces. In this manner, the solder material is configured to melt at a temperature substantially lower than the melting temperature of the work pieces being joined. As described herein, a soldered connection can refer to a connection between, for example, two electrical pads, an electrical pad and an electrical pin, and an electrical pin and a via included in a PCB, and/or any other suitable connection.

As used herein, the terms "tensile strength" and "shear strength" refer to a materials ability to resist breaking under an applied force. More specifically, the term "tensile strength" refers to a material's ability to resist breaking when subjected to a tensile or compressive force. For example, an integrated substrate (and/or couplers included in the integrated substrate) can be exposed to a tensile force when a first substrate of the integrated substrate is bent relative to a second substrate of the integrated substrate. The term "shear strength" refers to a material's ability to resist breaking when subjected to a shear force. For example, the integrated substrate (and/or the couplers included in the integrated substrate) can be exposed to a shear force when the first substrate is pulled apart from the second substrate in a planar direction (e.g., along a plane defined by the first substrate and the second substrate).

As used herein the term "data processing unit" refers to, for example, any computer, electronic switch, switch fabric, portion of a switch fabric, router, host device, data storage device, line card, backplane or the like used to process, transmit and/or convey electrical and/or optical signals. A data processing unit can include, for example, a component included within an electronic communications network. In some embodiments, for example, a data processing unit can be a component included within or forming a portion of a core switch fabric of a data center. In other embodiments, a data processing unit can be an access switch located at an edge of a data center, or a host or peripheral device (e.g., a server) coupled to the access device. For example, an access switch can be located on top of a chassis containing several host devices.

A printed circuit board used in high-speed signal transfer can include, for example, at least a conducting layer and at least an insulating layer. The conducting layer or layers can include transmission lines such as, for example, microstrips or striplines. The insulating layer or layers can include any suitable dielectric material. For example, in some embodiments, the insulating layer can be any suitable cotton paper and epoxy combination, woven glass and epoxy combination, matte glass and polyester combination, or the like. In some embodiments, a PCB can include dielectric materials from manufacturers such as, for example, GETEK, Nelco, Speedboard, and/or the like.

FIG. 1 is a side view schematic illustration of a portion of a printed circuit board 100, according to an embodiment. The printed circuit board (PCB) 100 can be any suitable PCB configured, at least in part, for use in high-speed signal transfer. For example, in some embodiments, the PCB 100 can be included in a data processing unit, such as those described above. The PCB 100 includes at least a first substrate 110, a second substrate 130, a first coupler 150, and a second coupler 170.

The first substrate 110 includes an electrical pad 121 and is configured to form a portion of the PCB 100. The first substrate 110 is formed from a first dielectric material. The first dielectric material can be any suitable dielectric material. In some embodiments, the first dielectric material can be, for example, Nelco having desirable high speed properties and low losses. In this manner, the first substrate 110 can be configured to receive a set of high-speed electrical components (not shown in FIG. 1).

The second substrate 130 includes an electrical pad 141 and is configured to form a portion the PCB 100. The second substrate 130 is formed from a second dielectric material, substantially different from the first dielectric material. For example, in some embodiments, the second substrate 130 can be formed from FR-4, which has significantly lower purchase price than Nelco but a much lower performance than Nelco at signal frequencies (component frequencies) above 3 GHz. In some embodiments, the second substrate 130 can be configured to receive a set of non-high speed electrical components (not shown in FIG. 1); thus, dielectric material configured for high-speed data transfer (e.g., the first dielectric material forming the first substrate 110) is not needed for the second substrate 130.

The first substrate 110 and the second substrate 130 are configured to be mechanically and electronically coupled to form the PCB 100. Furthermore, the first substrate 110 and the second substrate 130 can be coupled to form a substantially coplanar PCB 100. The first coupler 150 is configured to mechanically couple the first substrate 110 to the second substrate 130. The first coupler 150 can be any suitable coupler. For example, in some embodiments, the first coupler 150 can be a metallic bar configured to be mechanically fastened (e.g., screws, rivets, nails, pins, or the like) to the first substrate 110 and the second substrate 130. In some embodiments, the first coupler 150 can be coupled to the first substrate 110 and the second substrate 130 via an adhesive. While shown in FIG. 1 as being disposed at or on a lower portion of the first substrate 110 and the second substrate 130, the first coupler 150 can be disposed at any suitable location. In other embodiments, the first coupler 150 can define a substantially "C" shaped cross-section. In this manner, the first coupler 150 can be configured to engage three surfaces of the first substrate 110 and the second substrate 130 (e.g., a top surface, a side surface, and a bottom surface). In still other embodiments, the first coupler 150 can be formed of a non-conducting material such as, for example, a plastic, a ceramic, a polymer, a composite, and/or the like.

The second coupler 170 is configured to electrically couple the first substrate 110 to the second substrate 130. More specifically, the second coupler 170 includes a first end portion 171 configured to engage the electrical pad 121 of the first substrate 110 and a second end portion 172 configured to engage the electrical pad 141 of the second substrate 130. In some embodiments, the first end portion 171 and the second end portion 172 can include a shoulder, a tab, a pin, and/or any other suitable portion configured to be soldered to electrical pad 121 and the electrical pad 141, respectively. In some embodiments, the first substrate 110 can be disposed adjacent to the second substrate 130 such that a center point of the electrical pad 121 of the first substrate 110 and a center point of the electrical pad 141 of the second substrate 130 define a given distance. In such embodiments, the second coupler 170 can define a length substantially longer than the given distance between the center points of the electrical pad 121 and 141. In this manner, the second coupler 170 can be configured to substantially maximize the area of the portion of the second coupler 170 in contact with the electrical pads 121 and 141, thereby providing an electrical connection of suitable quality.

The second coupler 170 can be any suitable size, shape, or configuration. For example, in some embodiments, the second coupler 170 can be formed from a conductive material, such as, copper. While shown in FIG. 1 as being substantially planar the second coupler 170 can be any suitable shape. For example, in some embodiments, the first substrate 110 can have a first thickness and the second substrate 130 can have a second thickness, substantially less than the first thickness. In such embodiments, the second coupler 170 can include a step or bend such that a horizontal plane defined by the first end portion 171 and a horizontal plane defined by the second end portion 172 are substantially non-coplanar. In other embodiments, the second coupler 170 can be configured to couple the first substrate 110, with a first thickness, and the second substrate, with a second thickness, substantially greater than the first thickness.

In some embodiments, the first coupler 150 is configured to rigidly and fixedly couple the first substrate 110 and the second substrate 130 such that the strain within the second coupler 170 is reduced. Expanding further, the first coupler 150 has a tensile strength and a shear strength larger than a tensile strength and a shear strength of the second coupler 170. Moreover, the method of coupling the first coupler 150 to the first substrate 110 and the second substrate 130 (e.g., an adhesive, screws, bolts, or the like) results collectively in a tensile strength and shear strength larger than a tensile strength and a shear strength collectively resulting from the method of coupling the second coupler 170 to the first substrate 110 and the second substrate 130 (e.g., a soldered connection). In this manner, the first coupler 150 is configured to physically couple the first substrate 110 to the second substrate 130 without electrically coupling the first substrate 110 and the second substrate 130. Similarly, the second coupler 170 is configured to electrically couple the first substrate 110 to the second substrate 130. In some embodiments, the second coupler 170 can define any suitable feature configured to relieve strain within the second coupler 170.

With the first coupler 150 and the second coupler 170 mechanically and electrically coupling the first substrate 110 and the second substrate 130, the electronic components disposed on the first substrate 110 are in electrical communication with the electronic components disposed on the second substrate 130. Furthermore, the electronic components disposed on the first substrate 110 and the electronic components disposed on second substrate 130 can operate at their proper speeds (operational frequencies), even when sending signals between the first substrate 110 and second substrate 130, because the first substrate 110 is made of a suitable dielectric material for the high-speed electronic components disposed on it and the second substrate 130 is made of a suitable dielectric material for the non-high-speed electronic components disposed on it, as discussed above.

Although the high-speed electronic components disposed on the first substrate 110 and the non-high-speed electronic components disposed on the second substrate 130 are not shown in FIG. 1, it should be understood that such components can be disposed on either side of the first substrate 110 and the second substrate 130, respectively. For example, such components can be disposed on a top surface and/or a bottom surface of the first substrate 110 and the second substrate 130, respectively. Furthermore such components can be disposed on the respective the first substrate 110 and the second substrate 130 through any appropriate technique. For example, as discussed in further detail below, such components can be surface mounted on an integrated substrate (formed of the first substrate 110 and the second substrate 130) to define a printed circuit board assembly.

Figure 2:
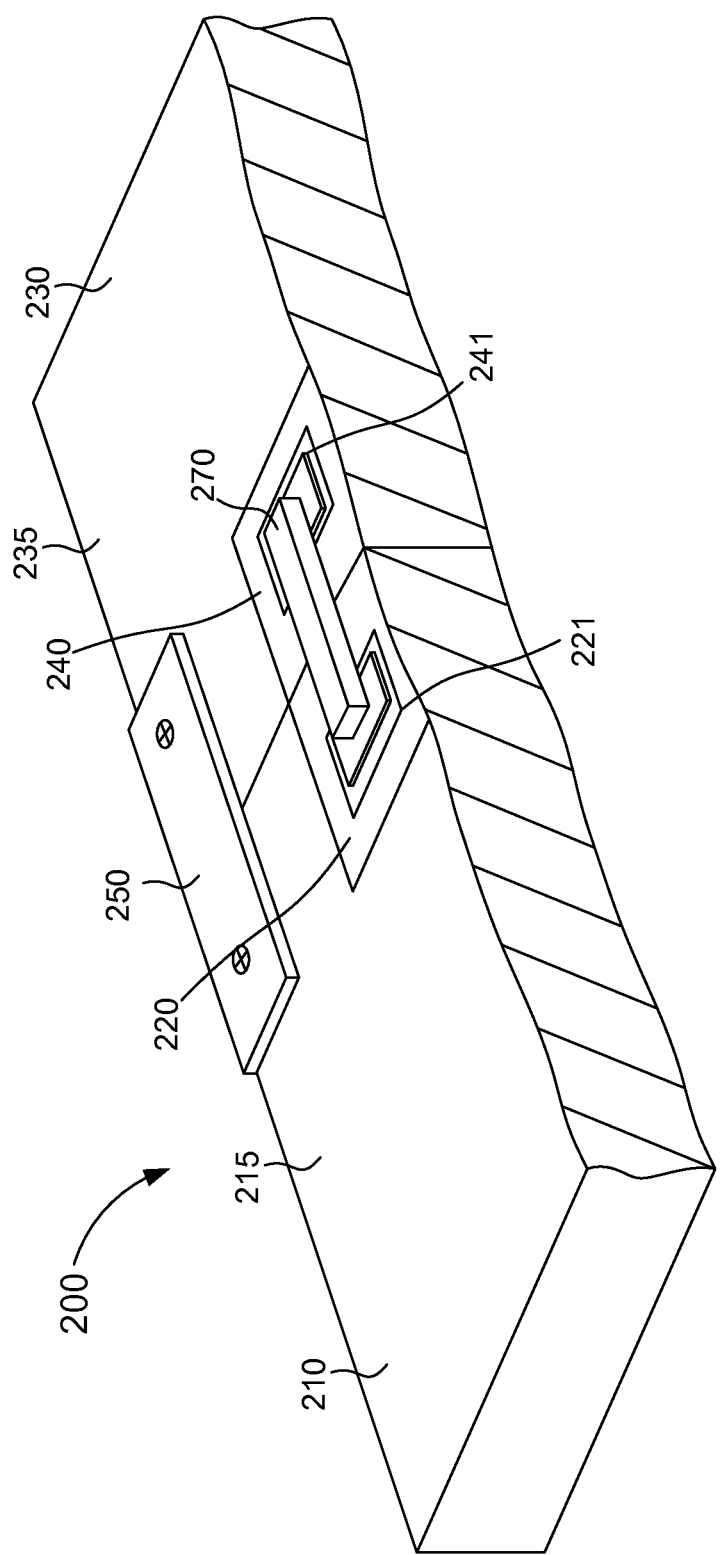
FIG. 2 is a perspective view schematic illustration of a portion of a printed circuit board, according to an embodiment.

FIG. 2 is a schematic illustration of a portion of a PCB 200 according to an embodiment. The PCB 200 can be any suitable PCB configured, at least in part, for use in high-speed data transfer. The PCB 200 includes a first substrate 210, a second substrate 230, a first coupler 250, and a second coupler 270. In some embodiments, portions of the PCB 200 can be substantially similar to portions of the PCB 100, described above with respect to FIG. 1. Therefore, some portions of the PCB 200 are not described in further detail herein.

The first substrate 210 includes a first portion 215 that is free from electronic connections, and a second portion 220 that includes electrical connections. For example, as shown in FIG. 2, the second portion 220 includes the electrical connection 221. Similarly, the second substrate 230 includes a first portion 235 that is free from electronic connections, and a second portion 240 that includes electrical connections (e.g., an electrical connection 241). The electrical connection 221 and the electrical connection 241 each can be any suitable connection. For example, in some embodiments, the electrical connection 221 and 241 can be electrical pads, vias, wires, transmission lines, strip lines, micro strips, and/or the like.

The first substrate 210 and the second substrate 230 are configured to be mechanically and electrically coupled to form the PCB 200. Furthermore, the first substrate 210 and the second substrate 230 can be coupled to form a substantially coplanar PCB 200. The first coupler 250 is configured to mechanically couple the first substrate 210 to the second substrate 230. More specifically, the first coupler 250 is configured to be coupled to the first portion 215 of the first substrate 210 and the first portion 235 of the second substrate 230. Similarly stated, the first coupler 250 is configured to engage the portions (e.g., the first portion 215 and the first portion 235) of the first substrate 210 and the second substrate 230 that are free from electrical connections.

The first coupler 250 can be any suitable coupler. For example, in some embodiments, the first coupler 250 can be a metallic bar configured to be mechanically fastened (e.g., screws, rivets, nails, pins, or the like) to the first substrate 210 and the second substrate 230. In some embodiments, the first coupler 250 can be coupled to the first substrate 210 and the second substrate 230 via an adhesive. In some embodiments, the first coupler 250 can define a substantially "C" shaped cross-section. In this manner, the first coupler 250 can be configured to engage three surfaces of the first substrate 210 and the second substrate 230 (e.g., a top surface, a side surface, and a bottom surface). In still other embodiments, the first coupler 250 can be formed of a non-conducting material such as, for example, a plastic, a ceramic, a polymer, a composite, and/or the like.

The second coupler 270 is configured to electrically couple the first substrate 210 to the second substrate 230. More specifically, the second coupler 270 is configured to be coupled to the second portion 220 of the first substrate 210 and the second portion 240 of the second substrate 230. In this manner, a first portion of the second coupler 270 can be coupled to the electrical connection 221 disposed within the second portion 220 of the first substrate 210, and a second portion of the second coupler 270 can be coupled to the electrical connection 241 disposed within the second portion 240 of the second substrate 230. In some embodiments, the first portion and the second portion of the second coupler 270 can include a shoulder, a tab, a pin, and/or any other suitable portion configured to be soldered to the electrical connection 221 and the electrical connection 241, respectively.

The second coupler 270 can be any suitable size, shape, or configuration. For example, in some embodiments, the second coupler 270 can be formed from a conductive material, such as, copper. While shown in FIG. 2 as being substantially planar the second coupler 270 can be any suitable shape. In some embodiments, the second coupler 270 can define any suitable feature configured to relieve strain within the second coupler 270. Furthermore, the first coupler 250 can rigidly and fixedly couple the first substrate 210 and the second substrate 230 such that the strain within the second coupler 270 is reduced. In this manner, the first coupler 250 can physically couple the first substrate 210 to the second substrate 230 without electrically coupling the first substrate 210 and the second substrate 230. Similarly, the second coupler 270 can electrically couple the first substrate 210 to the second substrate 230.

Figure 3:
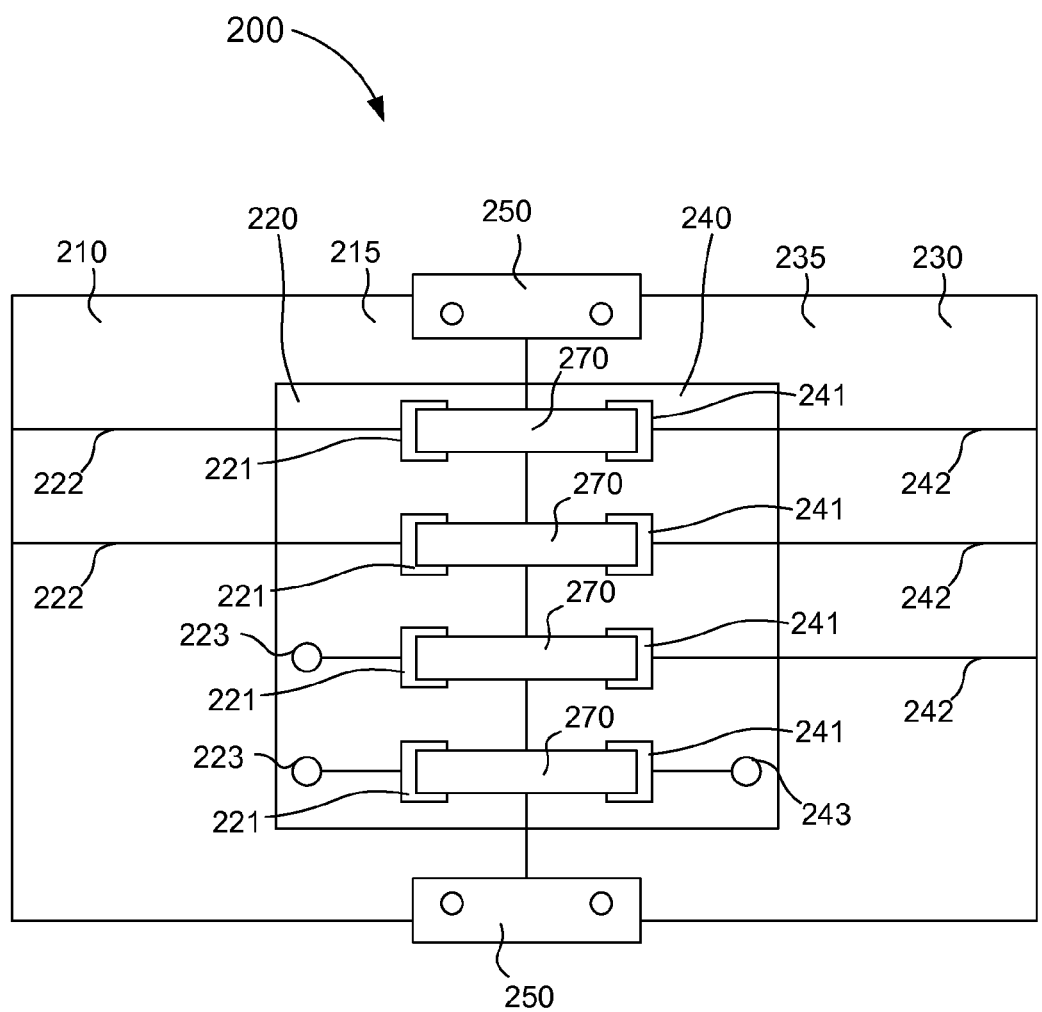
FIG. 3 is a top view schematic illustration of a printed circuit board according to the embodiment of FIG. 2.

While the first substrate 210 and the second substrate 230 each is shown in FIG. 2 as including only one electrical connection (e.g., the electrical connection 221 and the electrical connection 241, respectively), the PCB 200 can include multiple electrical connections. For example, FIG. 3 illustrates at least a portion of the PCB 200 including multiple electrical connections. In such embodiments, the electrical connections 221 and 241 can be electrically and physically coupled to any suitable electrical component. For example, some of the electrical connections 221 and 241 can be electrically and physically coupled to transmission lines 222 and 242, respectively. Similarly, some of the electrical connections 221 and 241 can be electrically and physically coupled to vias 223 and 243, respectively. In this manner, the second coupler 270 can be electrically coupled to an electrical component (not shown in FIG. 3) disposed, for example, on an opposite side of the PCB 200 than the second coupler 270.

As shown in FIG. 3, the second couplers 270 can be configured to be symmetrically coupled to the first substrate 210 and the second substrate 230, or asymmetrically coupled to the first substrate 210 and the second substrate 230. For example, a second coupler 270 from the set of second couplers 270 can be coupled to electrical connections 221 and 241 that are further electrically coupled to transmission lines 222 and 242. In addition, a second coupler 270 from the set of second couplers 270 can be coupled to electrical connections 221 and 241 that are further electrically coupled to a via 223 and a transmission line 242, respectively. In this manner, an electrical component disposed on, for example, the first substrate 210 can be electrically coupled, via a second coupler 270, to any suitable electrical component disposed on the second substrate 230.

Figure 4:
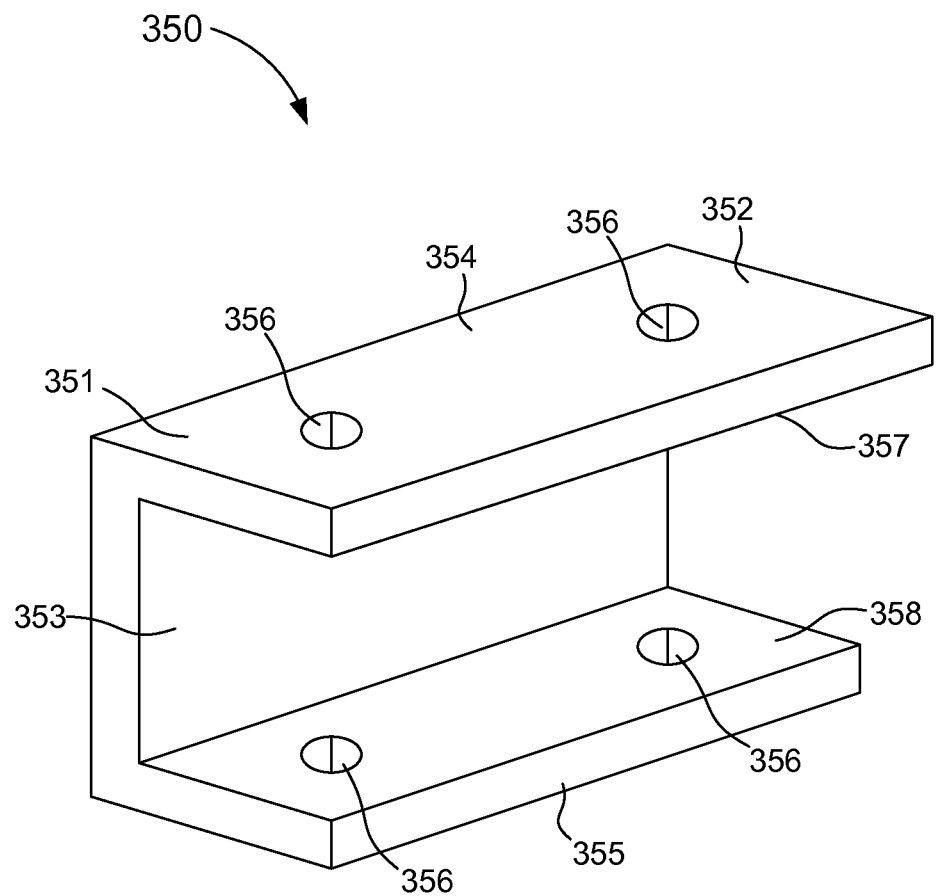
FIG. 4 is a perspective view schematic illustration of a first coupling member according to an embodiment.

Referring now to FIG. 4, in some embodiments, a first coupler 350 can be configured to physically connect a first substrate and a second substrate to form an integrated substrate. More specifically, the first coupler 350 includes a first end portion 351 configured to be coupled the first substrate and a second end portion 352 configured to be coupled to the second substrate. The first coupler 350 further includes a side wall 353 with a first leg 354 and a second leg 355. In this manner, the first coupler 350 can define a substantially "C" shaped cross-section. In use, the first leg 354 and the second leg 355 are configured to engage a first surface and a second surface (opposite the first surface) of the first substrate and a first surface and second surface (opposite the first surface) of the second substrate. Furthermore, the side wall 353 can engage a surface of the substrates that is substantially perpendicular to the first surface and the second surface (e.g., a side surface).

The first coupler 350 defines a set of apertures 356. The apertures 356 can be configured to receive any suitable mechanical fastener. For example, in some embodiments, the apertures 356 in the first leg 354 can receive a first set of screws (not shown) and the apertures 356 in the second leg can receive a second set of screws (not shown). In other embodiments, the apertures 356 of the first leg 354 and the second leg 355 are axially aligned such that a first aperture 356 of the first leg 354 and a first aperture 356 of the second leg 355 can receive a first bolt and a second aperture 356 of the first leg 354 and a second aperture 356 of the second leg 355 can receive a second bolt. In this manner, the bolts can pass through the substrate material such that the first coupler 350 is coupled to the first substrate to the second substrate. In other embodiments, the apertures 356 can receive, for example, rivets. In still other embodiments, the first coupler 350 need not include apertures 356 and can be coupled to the first substrate and the second substrate via an adhesive.

While inner surfaces of the side wall 353, the first leg 354, and the second leg 355 are shown as being substantially flat (e.g., planar) in FIG. 4, in other embodiments, the inner surfaces of the side wall 353, the first leg 354, and/or the second leg 355 can include a step or discontinuity. For example, in some embodiments, the first leg 354 of the first coupler 350 can include a step such that an inner surface 357 of the first leg 354 at the first end portion 351 extends beyond the inner surface 357 at the second end portion 352. Similarly stated, the inner surface 357 of the first leg 354 includes a step such that the distance between the inner surface 357 of the first leg 354 and an inner surface 358 of the second leg 355 at the first end portion 351 is substantially smaller than the distance at the second end portion 352. In this manner, the first coupler 350 can be configured to physically couple a first substrate of a first thickness to a second substrate of a second thickness (thicker than the first substrate). In some embodiments, the inner surface 357 of the first leg 354 and the inner surface 358 of the second leg 355 can both include a step (e.g., at the first end portion 351 or at the second end portion 352).

Figure 5:
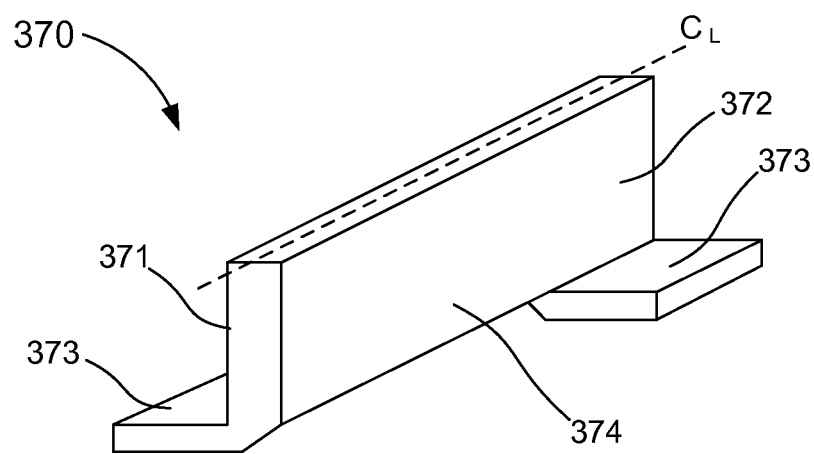
FIG. 5 is a perspective view schematic illustration of a second coupling member according to an embodiment.
Figure 6:
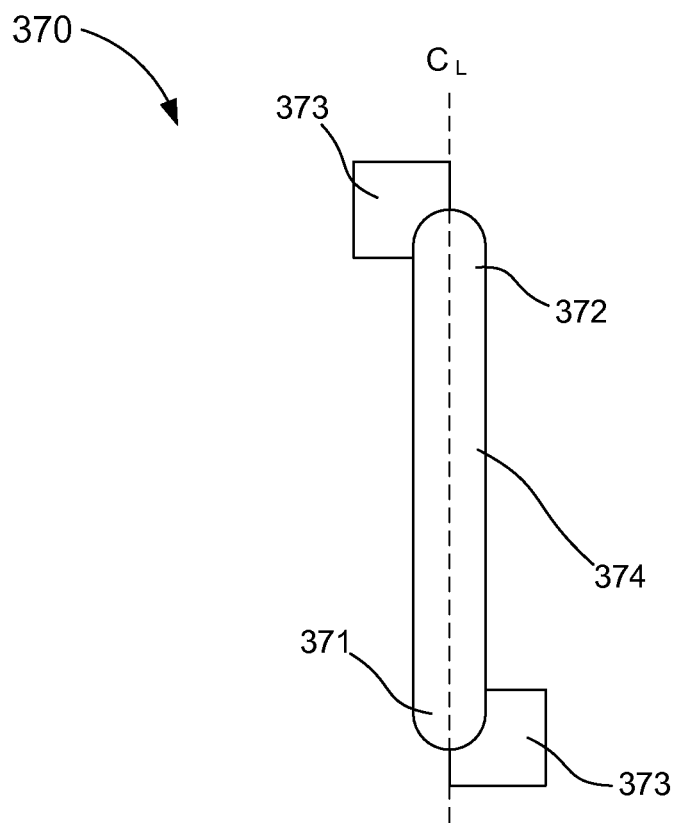
FIG. 6 is a top view schematic illustration of the second coupling member of FIG. 5.

As described above, a PCB can include a second coupler of any suitable size, shape, or configuration. For example, FIG. 5 illustrates a second coupler 370 according to an embodiment. The second coupler 370 includes an extension 374 having a first end portion 371 and a second end portion 372. The second coupler 370 further includes a set of electrical pads 373 extending from the extension 374. More specifically, the first end portion 371 can include an electrical pad 373 extending, substantially perpendicularly, from the extension 374 in a first direction and the second end portion 372 can include an electrical pad 373 extending, substantially perpendicularly, from the extension 374 in a second direction, opposite the first direction. Similarly stated, the electrical pad 373 at the first end portion 371 is disposed on a first side of the extension 374, and the electrical pad 373 at the second end portion 372 is disposed on a second side of the extension 374 opposite the first side. As shown in FIG. 6, the extension 374 can be configured to define a substantially linear (e.g., straight) centerline $C_L$. In other embodiments, the centerline $C_L$, need not be straight, as further described herein.

While shown in FIGS. 5 and 6 as including electrical pads 373 in some embodiments, the second coupler can alternatively include a set of electrical pins (e.g., relatively thin strips of conductive material) extending from the extension 374. Furthermore, while shown on opposite sides of the extension 374, in some embodiments, the electrical pads 373 can be disposed on the same side of the extension 374.

Figure 7:
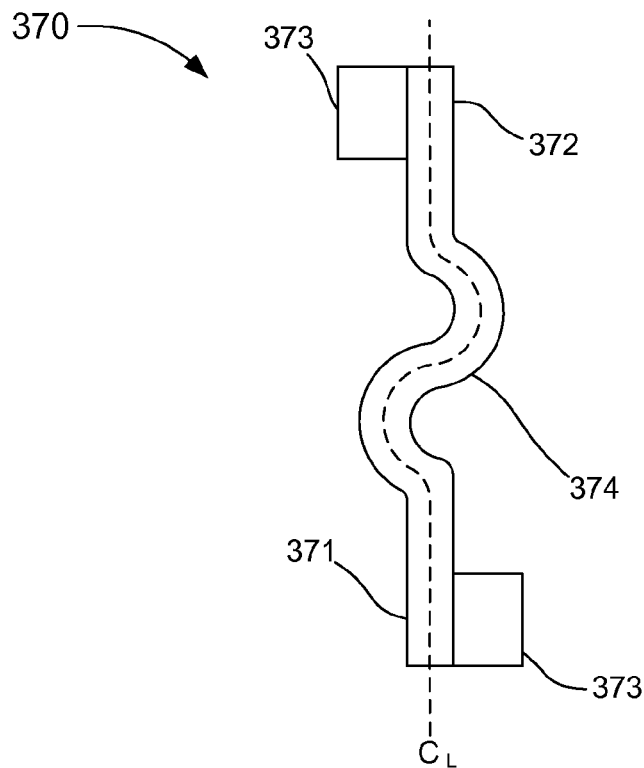
FIG. 7 is a top view schematic illustration of a second coupling member according to an embodiment.

Referring to FIG. 7, in some embodiments, a second coupler 370 can define a substantially nonlinear or curvilinear centerline $C_L$. In some embodiments, the extension 374 can define a substantially curved path allowing for stress relief of the second coupler 370. For example, in some embodiments, the heat added during a manufacturing process (e.g., a soldering process) can induce thermal expansion within the second coupler 370. In such embodiments, the non-linear centerline of the second coupler 370 can be configured such that the stress from thermal expansion does not substantially build within the second coupler 370. Expanding further, in some embodiments, the second coupler 370 is configured such that the non-linear centerline allows for a given amount of flexing (e.g., thermal expansion and contraction) during a manufacturing process and/or during use. In this manner, the failure rate of a soldered connection between the second coupler 370 and an electrical pad of a substrate can be reduced.

Figure 8:
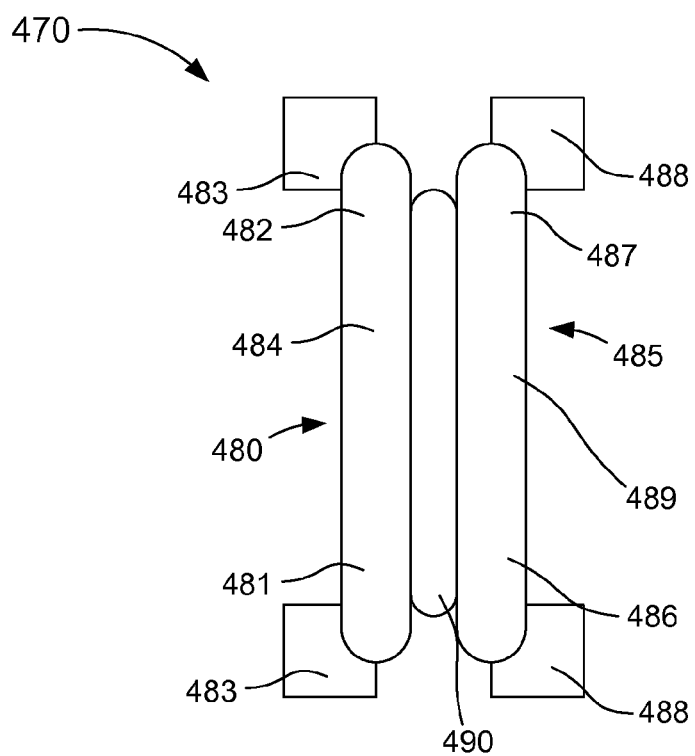
FIG. 8 is a top view schematic illustration of a second coupling member according to an embodiment.

While the second couplers described herein have been a monolithically constructed coupler (e.g., a single piece of conducting material), in some embodiments, a second coupler can be formed from multiple pieces of conducting material. In some embodiments, for example as shown in FIG. 8, a second coupler 470 can include a first member 480 and a second member 485. The first member 480 can include an extension 484 having a first end portion 481 and a second end portion 482. Similarly, the second member 485 can include an extension 489 having a first end portion 486 and a second end portion 487. The first member 480 and the second member 485 further include electrical pads 483 and 488, respectively. The electrical pads 483 and 488 can be substantially similar to the electrical pads 473 described above.

The second coupler 470 can further include a dielectric portion 490 disposed between the first member 480 and the second member 485. In some embodiments, the dielectric portion 490 is coupled to the first member 480 and the second member 485 via an adhesive. In other embodiments, when the first member 480 and second member 485 are coupled to an electrical contact (e.g., as described above) the dielectric portion 490 forms a friction fit with the first member 480 and the second member 485. The arrangement of the first member 480, the second member 485, and the dielectric portion 490 can be such that an desired impedance defined by the first member 480 and the second member 485 can be maintained. In other embodiments, the first member 480 and the second member 485 can define a differential pair, commonly found in high speed data transfer. In such embodiments, the first member 480 can define a first electrical coupling and the second member 485 can define a second electrical coupling.

Figure 9:
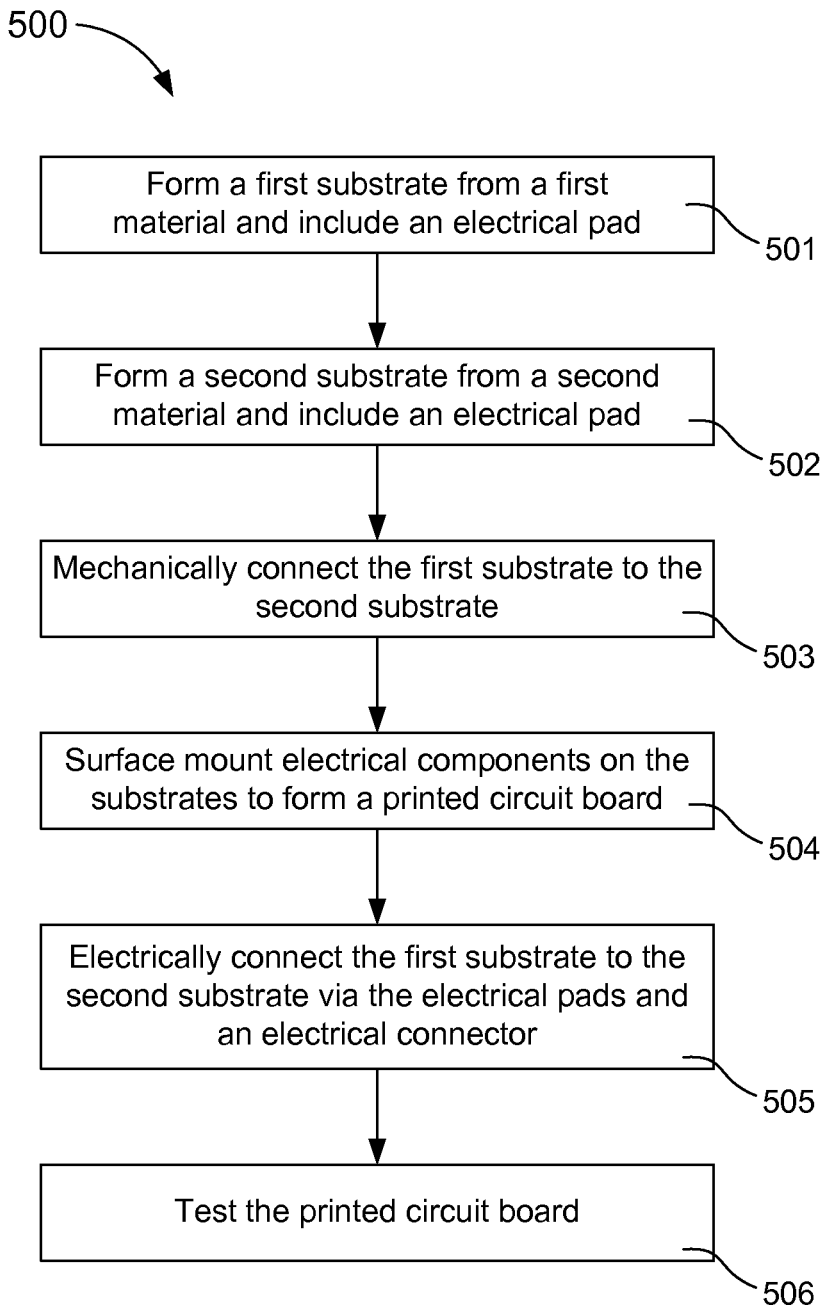
FIG. 9 is a flowchart illustrating a method for forming a printed circuit board, according to an embodiment.

FIG. 9 is a flowchart illustrating a method of manufacturing a printed circuit board, according to an embodiment. The method 500 includes forming a first substrate from a first material such that the first substrate includes at least one electrical pad, at 501. The first material can be any suitable dielectric material such as, for example, Nelco. The method 500 also includes forming a second substrate from a second material such that the second substrate includes at least one electrical pad, at 502. In some embodiments, the second material is a second dielectric material, different from the first dielectric material, such as, for example, FR-4.

The method 500 further includes mechanically connecting the first substrate to the second substrate, at 503. For example, in some embodiments, the first substrate can be coupled to the second substrate using any suitable coupler, such as the first couplers described herein. In this manner, a first coupler can be configured to physically couple the first substrate to the second substrate without electrically coupling the first substrate to the second substrate. With the first substrate coupled to the second substrate, the method 500 can include surface mounting electrical components on the first substrate and the second substrate to form a printed circuit board, at 504. For example, in some embodiments, the electrical components can be mounted to the first substrate and second substrate using any known surface mounting process.

The method 500 further includes electrically connecting the first substrate to the second substrate via the electrical pads and a surface mounted electrical connector, at 505. For example, in some embodiments, the electrical connector can be a strip of copper including a first connector portion (e.g., a pin, pad, landing, or the like) configured to be soldered to the electrical pad of the first substrate and a second connector portion configured to be soldered to the electrical pad of the second substrate. With the first substrate electrically and physically connected to the second substrate the method 500 can include electrically testing the printed circuit board, at 506. Expanding further, after physically connecting the first substrate and the second substrate and using a surface mounted electrical connector between the first substrate and the second substrate, the first substrate and the second substrate can be electrically tested as a printed circuit board. Conversely, in known manufacturing processes, the first substrate and the second substrate are tested prior to being electrically and physically connected to form the printed circuit board. Therefore, in some embodiments, the method 500 can reduce the number of tests performed during a manufacturing process.

While various embodiments have been described above, it should be understood that they have been presented by way of example only, and not limitation. Where methods and/or schematics described above indicate certain events and/or patterns occurring in a certain order, the ordering of certain events and/or patterns may be modified. While the embodiments have been particularly shown and described, it will be understood that various changes in form and details may be made.

For example, the extension 374, shown and described above with reference to FIGS. 5 and 6, has a substantially constant size along the center line $C_L$, in other embodiments, an extension included in a second coupler can have a size that varies spatially along a centerline.

While the second coupler 370, shown and described above with reference to FIG. 8, has a dielectric portion 390 disposed between the first member 380 and the second member 385, in other embodiments, the dielectric portion 390 can be air. For example, in some embodiments, the first member 380 and the second member 385 can define a differential pair with a portion of air between the first member 380 and the second member 385 defining the dielectric material. In this manner, the low dielectric constant of the air can reduce signal noise and/or signal degradation along the first member 380 and the second member 385.

Although various embodiments have been described as having particular features and/or combinations of components, other embodiments are possible having a combination of any features and/or components from any of embodiments as discussed above.

What is claimed is:

1. An apparatus, comprising:
  a first substrate formed of a first material, the first substrate being connected to a high speed electrical component;
  a second substrate formed of a second material different from the from the first material, the second substrate being connected to a non-high speed electrical component;
  a first coupler fixedly and mechanically connecting the first substrate and the second substrate without a solder connection; and a second coupler fixedly and electrically connecting the first substrate and the second substrate, the second coupler having a first end portion soldered to an electrical pad of the first substrate and having a second end portion soldered to an electrical pad of the second substrate.

2. The apparatus of claim 1, wherein the second coupler has a non-linear centerline.

3. The apparatus of claim 1, wherein a portion of the second coupler has a non-linear centerline and defines a strain-relief portion.

4. The apparatus of claim 1, wherein the second coupler has a length greater than a distance between a center point of the electrical pad of the first substrate and the electrical pad of the second substrate.

5. The apparatus of claim 1, wherein the second coupler has a first substantially planar portion and a second substantially planar portion non-parallel to the first substantially planar portion.

6. The apparatus of claim 1, wherein the second coupler has a first portion, a second portion and a dielectric material disposed between the first portion and the second portion.

7. The apparatus of claim 1, wherein the second coupler defines a four-pin connection, a first pin and a second pin of the second coupler being fixedly connected to the electrical pad of the first substrate, a third pin and a fourth pin of the second coupler being fixedly connected to the electrical pad of the second substrate.

8. The apparatus of claim 1, wherein the first coupler connects the first substrate and the second substrate with a tensile strength and a shear strength greater than a tensile strength and a shear strength of the second coupler.

9. The apparatus of claim 1, wherein the second coupler has a first substantially planar portion and a second substantially planar portion non-parallel to the first substantially planar portion, the second coupler being a rigid object.

10. The apparatus of claim 1, wherein the first substrate has high speed properties and low losses.

11. The apparatus of claim 1, where the high speed electrical component is disposed on a top surface or a bottom surface of the first substrate.

12. The apparatus of claim 1, wherein the non-high speed electrical component is disposed on a top surface or a bottom surface of the second substrate.

13. The apparatus of claim 1, wherein the second coupler has a first portion, a second portion and a dielectric material disposed between the first portion and the second portion such that an impedance between the first portion and the second portion is maintained.

* * * * *